US009029758B2

(12) United States Patent
Nakamura (10) Patent No.: US 9,029,758 B2
(45) Date of Patent: May 12, 2015

(54) ENCODER AND APPARATUS USING THE SAME (71) Applicant: Canon Kabushiki Kaisha, Tokyo (JP)

(72) Inventor: Hitoshi Nakamura, Kawasaki (JP)

(73) Assignee: Canon Kabushiki Kaisha (JP)

( * ) Notice: Subject to any disclaimer, the term of this patent is extended or adjusted under 35 U.S.C. 154(b) by 97 days.

(21) Appl. No.: 13/874,584

(22) Filed: May 1, 2013

(65) Prior Publication Data
US 2013/0292557 A1 Nov. 7, 2013

(30) Foreign Application Priority Data

May 2, 2012 (JP) ................................. 2012-105120

(51) Int. Cl.
G01D 5/347 (2006.01)
H03M 1/28 (2006.01)
G01D 5/244 (2006.01)

(52) U.S. Cl.
CPC ........... *G01D 5/34776* (2013.01); *H03M 1/287* (2013.01); *G01D 5/24476* (2013.01)

(58) Field of Classification Search
CPC .............. G01D 5/347; G01D 5/34707; G01D 5/34715; G01D 5/3473; G01D 5/34746; G01D 5/34776; G01D 5/34784; G01D 5/34792; G01D 5/24471; G01D 5/24476
USPC ............... 250/231.1, 213.14, 231.16, 231.18, 250/237 G; 356/614, 615, 616, 617, 618, 356/619; 33/1 PT, 1 N, 1 L; 341/11, 13
See application file for complete search history.

(56) References Cited

U.S. PATENT DOCUMENTS

| 5,068,529 | A | * | 11/1991 | Ohno et al. | 250/231.18 |
| 5,235,181 | A | * | 8/1993 | Durana et al. | 250/231.18 |
| 5,252,825 | A | * | 10/1993 | Imai et al. | 250/231.18 |
| 5,563,408 | A | * | 10/1996 | Matsumoto et al. | 250/231.14 |
| 7,687,765 | B2 | * | 3/2010 | Sugiyama et al. | 250/231.13 |
| 7,943,897 | B2 | * | 5/2011 | Okada | 250/231.13 |
| 8,476,578 | B2 | * | 7/2013 | Nakamura | 250/231.13 |
| 2011/0147572 | A1 | * | 6/2011 | Nakamura | 250/231.16 |
| 2013/0096862 | A1 | * | 4/2013 | Nakamura | 702/94 |
| 2013/0099105 | A1 | * | 4/2013 | Nakamura et al. | 250/231.1 |
| 2013/0126718 | A1 | * | 5/2013 | Nakamura et al. | 250/231.1 |
| 2013/0163654 | A1 | * | 6/2013 | Nakamura | 375/226 |
| 2013/0292556 | A1 | * | 11/2013 | Nakamura | 250/231.1 |
| 2013/0292557 | A1 | * | 11/2013 | Nakamura | 250/231.1 |

* cited by examiner

FOREIGN PATENT DOCUMENTS

JP 2011-133286 A 7/2011

*Primary Examiner* — John Lee
(74) *Attorney, Agent, or Firm* — Rossi, Kimms & McDowell LLP (57) ABSTRACT

The encoder includes a scale provided with first and second tracks, a sensor relatively movable with the scale and reading periodic patterns to output periodic signals, and a processor calculating a position in a relative movement direction of the scale and sensor by using the periodic signals. The first track includes first and second periodic patterns whose periods are mutually different, and the second track includes a third periodic pattern whose period is different from that of the second pattern and is an integral multiple or an integral fraction of that of the first periodic pattern. The processor calculates, by using a phase difference between the periodic signals corresponding to the first and third periodic patterns, the position in which a sensor reading error due to a relative displacement between the first and second tracks and the sensor is corrected.

4 Claims, 5 Drawing Sheets

ENCODER AND APPARATUS USING THE SAME

BACKGROUND OF THE INVENTION

1. Field of the Invention

The present invention relates to an encoder that is usable for various apparatuses such as optical apparatuses and outputs, with relative movement of a scale and a sensor, a signal showing position of a movable member provided in the apparatus.

2. Description of the Related Art

Encoders that are used to detect position and speed of a movable member are constituted by a scale provided with a periodic pattern and a sensor outputting a periodic signal that periodically changes corresponding to the periodic pattern with relative movement of the sensor and the scale. Such encoders include an incremental encoder that, for example, produces two periodic signals (two phase signals) having mutually different phases from one periodic pattern and detects a relative position of the scale and the sensor from number of periods and the phases of the two phase signals. Moreover, the encoders also include an absolute encoder that, for example, produces two paired two phase signals from two periodic patterns having mutually different periods and detects an absolute position of the scale or the sensor from a difference (phase difference) between the phases of one of the two paired two phase signals and the phases of the other paired two phase signals.

Such an absolute encoder has an advantage that a reset operation to detect a reference position for position detection before start of the position detection such as at a time of power-on, which is needed for the incremental encoder, is not needed.

Furthermore, the encoders include one employing a vernier method as an angle detection method as disclosed in Japanese Patent Laid-Open No. 2011-133286. Such a vernier encoder uses a scale provided with multiple tracks including periodic patterns whose periods are mutually different. This vernier encoder calculates a phase difference between each two of multiple periodic signals detected from the respective tracks and having mutually different periods to produce a periodic signal called a vernier signal having a period different from those of the original multiple periodic signals.

In such a vernier encoder that reads the periodic patterns provided at multiple positions in the scale to perform phase difference calculation, a deformation of the scale or an installation error thereof to a member for holding the scale changes relative phases of the multiple periodic signals and thereby causes an error in the phase difference between the periodic signals, which makes it impossible to perform position detection with high accuracy.

SUMMARY OF THE INVENTION

The present invention provides an encoder capable of performing position detection with high accuracy even if there are error factors such as a deformation of a scale and an installation error.

The present invention provides as one aspect thereof an encoder including a scale provided with a first track and a second track each including at least one of periodic pattern, a sensor relatively movable with the scale and configured to read the periodic patterns to output periodic signals having periods respectively corresponding to the read periodic patterns, and a processor configured to calculate a position in a relative movement direction of the scale and sensor by using the periodic signals. The first track includes a first periodic pattern and a second periodic pattern whose periods are mutually different, and the second track includes a third periodic pattern whose period is different from that of the second pattern and is one of an integral multiple and an integral fraction of that of the first periodic pattern. The processor is configured to calculate, by using a phase difference between the periodic signals output from the sensor respectively corresponding to the first and third periodic patterns, the position in which a reading error of the sensor due to a relative displacement between the first and second tracks and the sensor is corrected.

The present invention provides as another aspect thereof an apparatus including a movable member whose position is detected by using the encoder.

Further features of the present invention will become apparent from the following description of exemplary embodiments with reference to the attached drawings.

DESCRIPTION OF THE PREFERRED EMBODIMENTS

Embodiments of the present invention will hereinafter be described with reference to the accompanying drawings.

Embodiment 1

Figure 1:
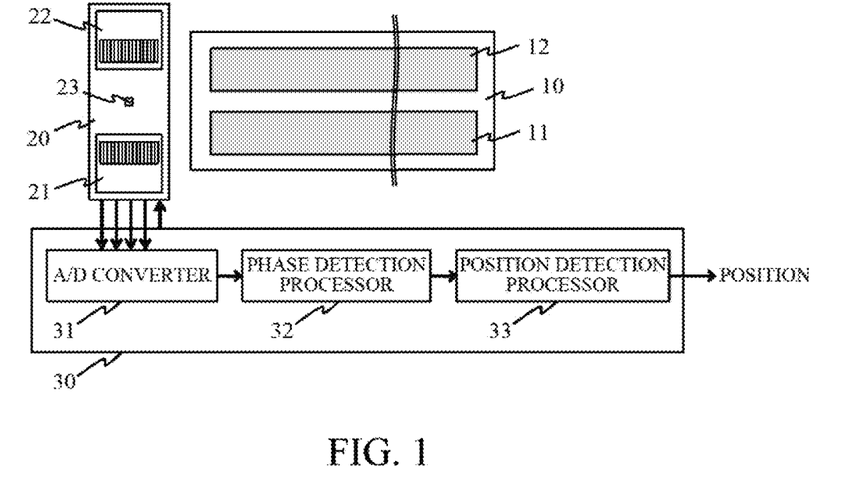
FIG. 1 is a block diagram showing a configuration of an encoder that is Embodiment 1 of the present invention.

FIG. 1 shows a configuration of a position detection encoder (hereinafter simply referred to as "an encoder") that is a first embodiment (Embodiment 1) of the present invention. The encoder 1 is constituted by a scale 10, a sensor 20 and a signal processor 30. The encoder 1 is an optical reflective absolute encoder capable of detecting a relative position of the scale 10 and sensor 20.

The scale 10 is attached to a position detection object member as a movable member that is provided in various apparatuses (each hereinafter referred to as "a higher-level apparatus") such as optical apparatuses. The sensor 20 is attached to an immovably fixed member such as a chassis of the higher-level apparatus. The encoder 1 of this embodiment outputs a signal showing movement amount (that is, position) of the scale 10 with movement of the scale 10 relative to the sensor 20. However, a configuration may be employed in which the sensor 20 is attached to the position detection object member and the scale 10 is attached to the fixed member and thereby a signal is output from the sensor 20 with movement of the sensor 20 relative to the scale 10. That is, it is only necessary that the scale 10 and the sensor 20 are relatively moved. Moreover, the encoder 1 of this embodiment is a linear encoder, but the configuration described in Embodiment 1 can be applied also to a rotary encoder.

In response to input of a position detection request signal from a system (not shown) of the higher-level apparatus equipped with the encoder, the signal processor 30 receives signals from the sensor 20 to perform a position detection process. Then, the signal processor 30 outputs information on an absolute position of the position detection object member, which has been acquired by the position detection process, to the system of the higher-level apparatus.

Figure 2:
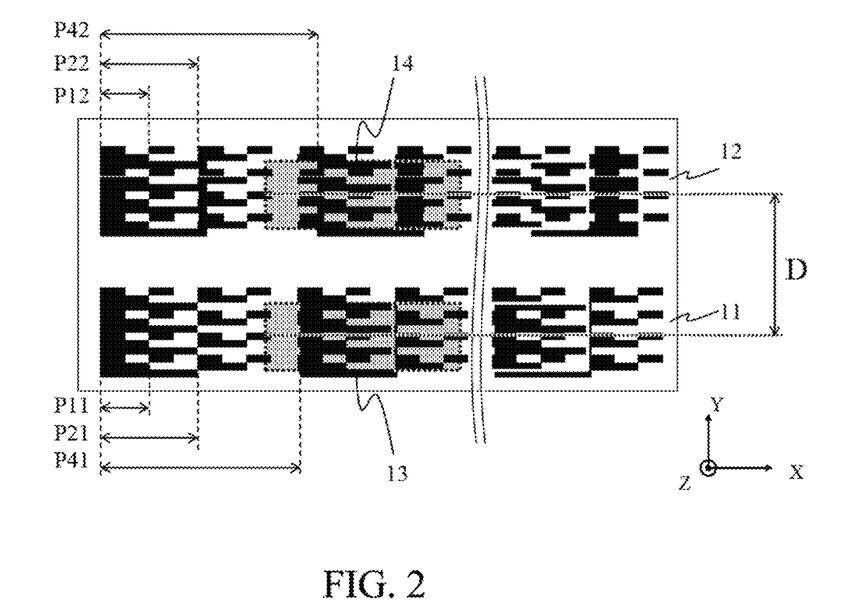
FIG. 2 shows a scale used in the encoder of Embodiment 1.

FIG. 2 shows the scale 10. In the following description, as directions for the scale 10, a direction corresponding to a relative movement direction of the scale 10 and sensor 20 (that is, an X direction in FIG. 2 and a longitudinal direction of the scale 10) is hereinafter referred to as "a position detection direction", and a direction (that is, a Y direction in FIG. 2) orthogonal to the position detection direction is referred to as "a scale width direction". The above-mentioned relative movement direction (position detection direction) is a direction in which the scale 10 is moved relatively to the sensor 20 by a driving force intentionally provided.

The scale 10 is provided with a first track 11 and a second track 12 arranged alternately in the scale width direction and each including multiple periodic patterns. Each of the periodic patterns includes reflective portions (each shown as a black portion in FIG. 2) and non-reflective portions (each shown as a white portion in FIG. 2) alternately arranged in the position detection direction at a constant period (pitch).

Each of the tracks 11 and 12 includes three types of periodic patterns having mutually different periods and arranged cyclically in the scale width direction. Specifically, the first track 11 includes a periodic pattern having a period P11, a periodic pattern having a period P21 and a periodic pattern having a period P41 (P11<P21<P41) arranged cyclically in this order from a boundary of the first and second tracks 11 and 12 toward an outside in the scale width direction. On the other hand, the second track 12 includes a periodic pattern having a period P12, a periodic pattern having a period P22 and a periodic pattern having a period P42 (P12<P22<P42) arranged cyclically in this order from the boundary toward the outside in the scale width direction. In the following description, the periodic patterns having the periods P11, P21, P41, P12, P22 and P42 are respectively referred to as "a P11 pattern", "a P21 pattern", "a P41 pattern", "a P12 pattern", "a P22 pattern" and "a P42 pattern". Moreover, the periods P11 to P42 are each referred to also as "a pattern period".

In this embodiment, numbers of periods (that is, numbers of the reflective portions) of the P11, P21 and P41 patterns in a total length (hereinafter referred to as "a total track length") of the first track 11 in the position detection direction are 4001, 2000 and 998, respectively. On the other hand, numbers of periods of the P12, P22 and P42 patterns in the total track length of the second track 12 in the position detection direction are 3983, 2000 and 908, respectively. Thus, the numbers of periods of the P21 and P22 patterns are equal to each other, and therefore the periods P21 and P22 are also equal to each other. In other words, the period of the P22 pattern is set to single, as an integral multiple, of that of the P21 pattern.

Moreover, the numbers of periods of the P11 and P12 patterns are set to about double of that of the P21 pattern; the periods P11 and P12 are set to about half of the period P21. Furthermore, the numbers of periods of the P41 and P42 patterns are set to about half of that of the P21 pattern; the periods P41 and P42 are set to about double of the period P21.

In this embodiment, the P21 pattern in the first track 11 corresponds to a first periodic pattern, and the P11 and P41 patterns therein each correspond to a second periodic pattern. Furthermore, the P22 pattern in the second track 12 corresponds to a third periodic pattern. The above-mentioned periods and numbers of periods are merely examples, so that other periods and number of periods may be used.

The P21 pattern in the first track 11 and the P22 pattern in the second track 12 are identical to each other at any positions in the position detection direction.

The sensor 20 is provided with a light source 23 such as an LED and two light receivers 21 and 22 each including multiple light receiving elements (photoelectric conversion elements). The light source 23 and the light receivers 21 and 22 are arranged on a same plane. Light emitted from the light source 23 toward the first track 11 is reflected by the reflective portions of the P11, P21 and P41 patterns, and the reflected light is received by the light receiver 21. On the other hand, light emitted from the light source 23 toward the second track 12 is reflected by the reflective portions of the P12, P22 and P42 patterns, and the reflected light is received by the light receiver 22.

In each of the light receivers 21 and 22, the multiple light receiving elements are arranged with a constant pitch in the position detection direction. Relative movement of the scale 10 and sensor 20 changes intensity of the light reflected by each pattern and received by each light receiving element. Thereby, each of the light receivers 21 and 22 photoelectrically converting the reflected light outputs, as a read periodic signal, two phase quasi sine wave signals (hereinafter simply referred to as "two phase signals").

The sensor 20 is capable of switching a pitch (hereinafter referred to as "a detection pitch") of the light receiving elements whose outputs are used for producing the two phase signals, among the multiple light receiving elements in each of the light receivers 21 and 22, to one of P10, P20 and P40, in response to a detection period switch signal from the system of the higher-level apparatus. The ratio of the detection periods P10, P20 and P40 is 1:2:4; the detection period P10 is approximately equal to the pattern periods P11 and P12, the detection period P20 is approximately equal to the pattern periods P21 and P22, and the detection period P40 is approximately equal to the pattern periods P41 and P42. A width between each two adjacent light receiving elements in each of the light receivers 21 and 22 is P10/2.

In this embodiment, since the encoder employs a reflective optical system in which the light source 23 and the light receivers 21 and 22 are arranged on the same plane in the sensor 20, an optical image of the periodic pattern projected onto each of the light receivers 21 and 22 formed by the light emitted from the light source 23 toward each of the tracks 11 and 12 and reflected thereby is doubled in size with respect to that of the periodic pattern. Therefore, the width P10/2 on each of the light receivers 21 and 22 corresponds to a width of P10/4 on each of the tracks 11 and 12.

In this embodiment, the sensor 20 divides the outputs from the light receiving elements into four types: A (+); B (+); A (−); and B (−), and produces two pairs of two phase signals (A phase signals and B phase signals) by using the following calculation:

$$A = A(+) - A(-)$$

$$B = B(+) - B(-).$$

Figure 3A:
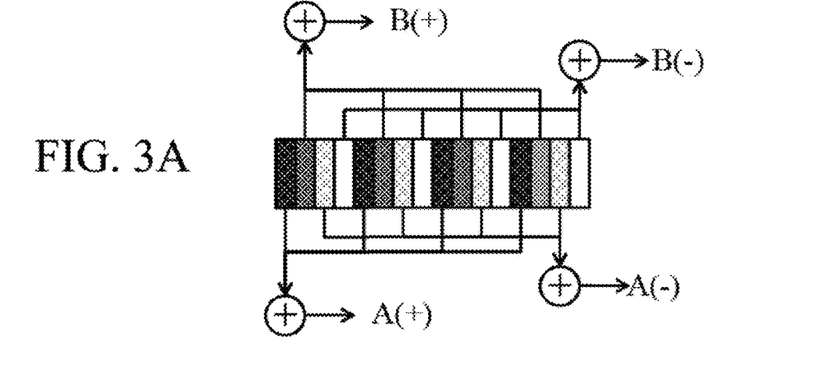
FIGS. 3A to 3C show combinations of light emitting elements of a sensor and outputs thereof in the encoder of Embodiment 1.
Figure 3B:
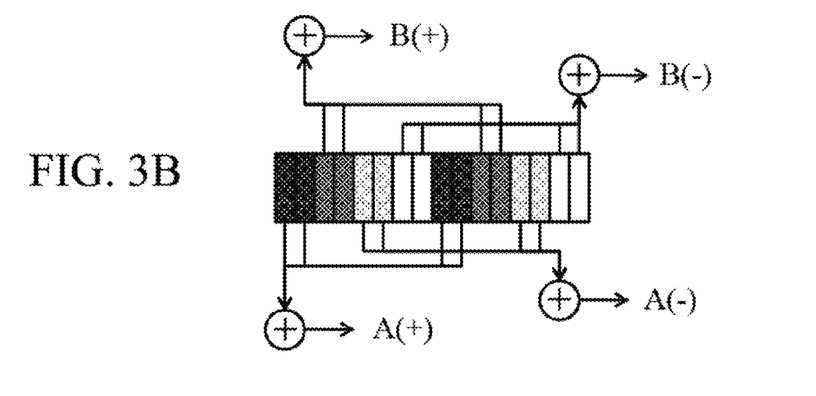
Figure 3C:
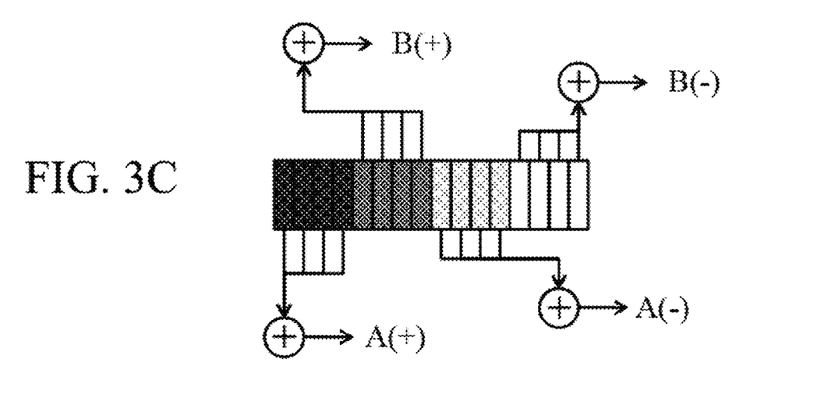

FIG. 3A shows a relation of the light receiving elements in each of the light receivers 21 and 22 when the periodic pattern is read with the detection period P10. When the periodic pattern is read with the detection period P10, two phase signals orthogonal to each other can be produced by using photoelectric conversion outputs corresponding to light amounts received at positions shifted with respect to each other by P10/2 in the position detection direction. Thus, the output of each one of the light receiving elements is cyclically set to A(+), B(+), A(−) and B(−) as shown in FIG. 3A. Similarly, when the periodic pattern is read with the detection period P20, the output of each two of the light receiving elements are set to A(+), B(+), A(−) and B(−) as shown in FIG. 3B. Moreover, when the periodic pattern is read with the detection period P40, the output of each four of the light receiving elements are set to A(+), B(+), A(−) and B(−) as shown in FIG. 3C. Such setting of the outputs of the light receiving elements enables production of the two phase signals using the respective detection periods.

Furthermore, since the sensor 20 outputs the two phase signals corresponding to intensity of received light on each light receiver, even if the detection period of the sensor 20 is somewhat shifted with respect to the period of the periodic pattern provided in the scale 10, the sensor 20 outputs a periodic signal having a period corresponding to that of the periodic pattern provided in the scale 10. Therefore, when the detection period of the sensor 20 is P10, the light receiver 21 outputs two phase signals having a period (change period) P11 and the light receiver 22 outputs two phase signals having a period (change period) P12.

When the detection period of the sensor 20 is set to one of P20 and P40, each of the light receivers 21 and 22 similarly outputs two phase signals having a period corresponding to the set detection period.

FIG. 2 shows reading areas 13 and 14 as areas surrounded by dotted lines where the light receivers 21 and 22 respectively read the periodic patterns in the first and second tracks 11 and 12. The reading areas 13 and 14 are partial areas in the first and second tracks 11 and 12 that the lights projected from the light source 23 thereonto and reflected thereat are received by the light receivers 21 and 22. The reading area 13 in the first track 11 includes the above-described three types of periodic patterns (P11, P21 and P41 patterns) having mutually different periods and arranged in the scale width direction. On the other hand, the reading area 14 in the second track 12 includes the above-described three types of periodic patterns (P12, P22 and P42 patterns) having mutually different periods and arranged in the scale width direction. Phases of the three types of periodic patterns readable (photoelectrically convertible) by each of the light receivers 21 and 22 change in synchronization with one another.

In the following description, a center-to-center distance between the reading areas 13 and 14 in the first and second tracks 11 and 12 in the scale width direction is defined as D, as shown in FIG. 2.

The signal processor 30 is constituted by an AD converter 31, a phase detection processor 32 and a position detection processor 33, and performs the position detection process by using the two phase signals output from the sensor 20.

Next, description will be made of the position detection process performed by the signal processor 30. The signal processor 30 first sets the detection period of the sensor 20 to P40 in response to the detection period switch signal input from the higher-level apparatus. The setting of the detection period P40 causes the sensor 20 to output two pairs of two phase signals (that is, two paired two phase signals) corresponding to the P41 and P42 patterns in the first and second tracks 11 and 12. The phase detection processor 32 simultaneously samples the two paired two phase signals corresponding to the P41 and P42 patterns (hereinafter referred to as "P41 signals" and "P42 signals") converted into digital signals by the AD converter 31.

Next, the signal processor 30 sets the detection period of the sensor 20 to P20 in response to the detection period switch signal input from the higher-level apparatus. The setting of the detection period P20 causes the sensor 20 to output two paired two phase signals corresponding to the P21 and P22 patterns in the first and second tracks 11 and 12. The phase detection processor 32 simultaneously samples the two paired two phase signals corresponding to the P21 and P22 patterns (hereinafter referred to as "P21 signals" and "P22 signals") converted into digital signals by the AD converter 31.

Furthermore, the signal processor 30 sets the detection period of the sensor 20 to P10 in response to the detection period switch signal input from the higher-level apparatus. The setting of the detection period P10 causes the sensor 20 to output two paired two phase signals corresponding to the P11 and P12 patterns in the first and second tracks 11 and 12. The phase detection processor 32 simultaneously samples the two paired two phase signals corresponding to the P11 and P12 patterns (hereinafter referred to as "P11 signals" and "P12 signals") converted into digital signals by the AD converter 31.

Thus, the reading of the two tracks 11 and 12 by the sensor 20 can provide the above-mentioned six paired two phase signals. The paired two phase signals are expressed as $\sin\theta$ and $\cos\theta$ where $\theta$ represents phase, so that performing arctan calculation on the paired two phase signals ($\sin\theta$ and $\cos\theta$) provides the phase ($0 \leq \theta < 2\pi$). Therefore, the phase detection processor 32 performs the arctan calculation on the six paired two phase signals to acquire six phases of the six paired two phase signals. In the following description, phases of the P11 and P12 signals are respectively referred to as "$\theta\theta P11$" and "$\theta P12$", phases of the P21 and P22 signals are respectively referred to as "$\theta\theta P21$" and "$\theta\theta P22$", and phase of the P41 and P42 signals are respectively referred to as "$\theta P41$" and "$\theta P42$".

The position detection processor 33 calculates the position in the relative movement direction of the scale 10 and sensor 20 (that is, in the position detection direction) from the six phases.

Figure 4A:
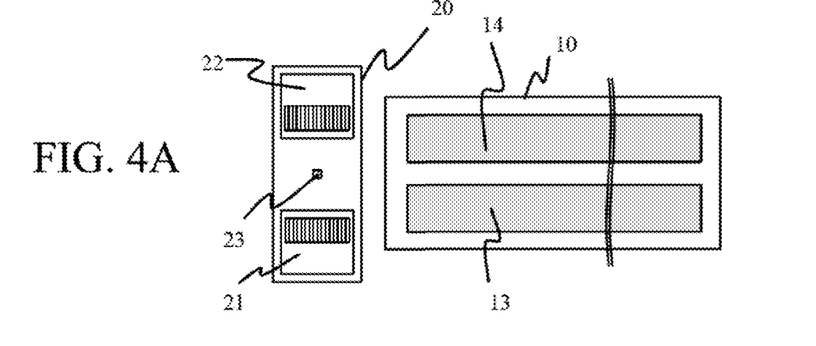
FIGS. 4A to 4D show positional relations between the scale and the sensor in the encoder of Embodiment 1.

The P21 pattern in the first track 11 and the P22 pattern in the track 12 are identical to each other at any position in the position detection direction. Therefore, as shown in FIG. 4A, when the scale 10 and the sensor 20 have an ideal positional relation, positions of the reading areas 13 and 14 (reading positions) on the scale 10 in the position detection direction are identical to each other, which makes the phases $\theta P21$ and $\theta P22$ equal to each other.

Figure 4B:
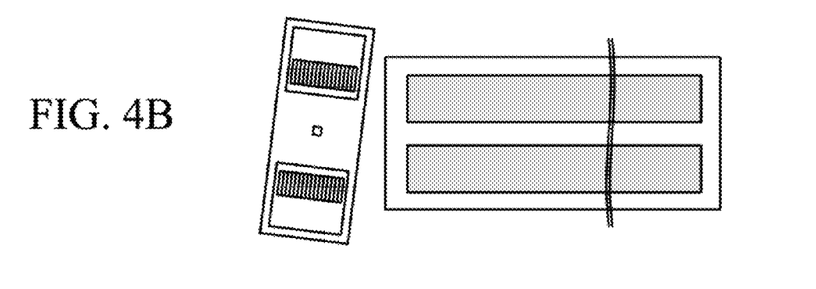

However, as shown in FIG. 4B, when the sensor 20 is rotated (obliqued) with respect to the scale 10 about a Z axis orthogonal to the position detection direction and scale width direction, the reading positions on the scale 10 in the position detection direction become different from each other, which makes the phases $\theta P21$ and $\theta P22$ different from each other. That is, the phases $\theta P21$ and $\theta P22$ have a difference therebetween.

Figure 4C:
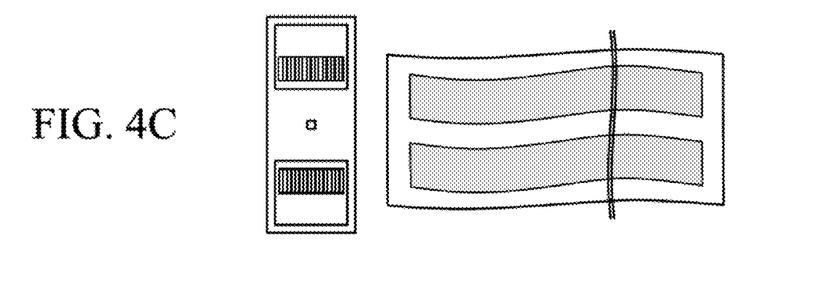

In addition, as shown in FIG. 4C, when the scale 10 is deformed, a positional relation between the first track 11 on the scale 10 and the light receiver 21 becomes different from that between the second track 12 on the scale 10 and the light receiver 22, which makes the phases $\theta P21$ and $\theta P22$ different from each other.

Such a relative positional shift (particularly, an oblique shift) of the scale 10 and the sensor 20 in directions other than the position detection direction or the deformation of the scale 10 causes a relative displacement of the scale 10 and the sensor 20, which causes a reading error (reading position error) of the sensor 20 that will be described below.

The relative positional shift (particularly, oblique shift) means a state where the sensor 20 is rotationally shifted (obliqued) with respect to the scale 10 in a sensor surface as a light receiving surface of the sensor 20 and a state where the scale 10 is rotationally shifted (obliqued) with respect to the sensor 20 in a scale surface of the scale 10 where the tracks 11 and 12 are provided. Moreover, the reading error of the sensor 20 (hereinafter referred to as "a sensor reading position error") means an error caused by, for example, that a pixel arrangement direction in which the light receiving elements of the sensor 20 are one-dimensionally arranged and a pattern period direction in which the periodic pattern has its period are relatively obliqued (that is, relatively displaced) to each other. Furthermore, the sensor reading error also means an error caused by that the sensor 20 reads a different position or a different pattern from a position or a pattern that the sensor 20 should read.

Thus, the position detection processor 33 calculates a difference between the reading positions of the first and second light receivers 21 and 22 on the scale 10 on a basis of the difference between the phases θP21 and θP22, and corrects (or compensates for) one or more of the above-mentioned six phases, which includes the sensor reading error, according to the difference between the reading positions. This correction corresponds to calculation of a final detection position in which the sensor reading error due to the relative displacement of the first and second tracks 11 and 12 and the light receivers 21 and 22 of the sensor 20. In other words, the position detection processor 33 calculates the position in the position detection direction by using a phase difference between the periodic signal output from the sensor 20 corresponding to the first periodic pattern and the periodic signal output therefrom corresponding to the third periodic pattern. Specifically, the position detection processor 33 calculates the position on a basis of corrected periodic signals obtained by correcting the periodic signals output form the sensor 20 corresponding to the first and second tracks 11 and 12 by using the above phase difference.

Figure 4D:
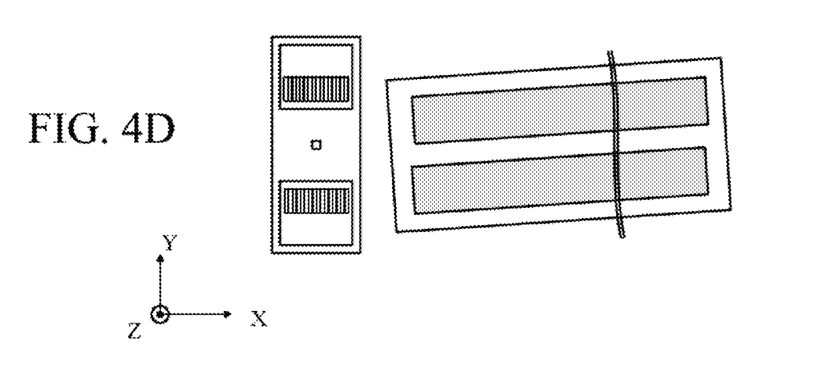

In the case shown in FIG. 4C, a relative positional shift of the scale 10 and the sensor 20 in the scale width direction also causes a difference between the phases θP21 and θP22. This embodiment also can correct an error caused by this difference. Furthermore, FIG. 4D shows a case where the scale 10 is rotated (obliqued) with respect to the position detection direction about the Z axis by an angle of θs. In this case, as well as the case shown in FIG. 4B, since the reading positions of the light receivers 21 and 22 on the scale 10 in the position detection direction are different from each other, the phases θP21 and θP22 have a difference therebetween. In addition, the oblique scale 10 also causes an error in the position detection direction. This embodiment also can correct this error. The correction process will be described later.

In order to calculate the difference between the reading position of the light receivers 21 and 22 on the scale 10, the position detection processor 33 first calculates a phase error corresponding to the difference between the phases θP21 and θP22. There are four types of phase relations between the phases θP21 and θP22, which are detectable in this embodiment. Specifically, in the case where, as shown in FIG. 4B, the scale 10 and the sensor 20 have the relative positional relation in which the sensor 20 is rotated (obliqued) with respect to the scale 10, the four types of phase relations between the phases θP21 and θP22, which include a positional relation, are as shown in FIGS. 5A, 5B, 5C and 5D. In FIGS. 5A to 5D, t1 and t2 respectively represent reading positions of the light receivers 21 and 22 on the P21 pattern and the P22 pattern (hereinafter collectively referred to as "P21/P22 patterns") in the position detection direction. In this description, a difference between the reading positions t1 and t2 is assumed not to exceed half of the period P21.

Figure 5A:
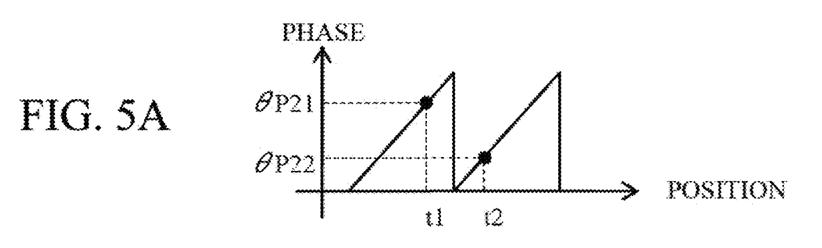
FIGS. 5A to 5D show relations between positions (t1 and t2) and phases ($\theta P21$ and $\theta P22$) in the encoder of Embodiment 1.
Figure 5B:
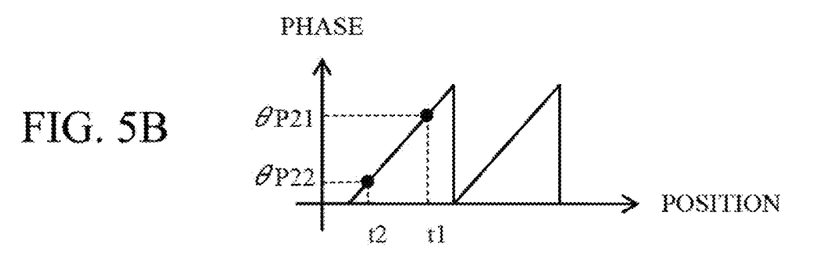
Figure 5C:
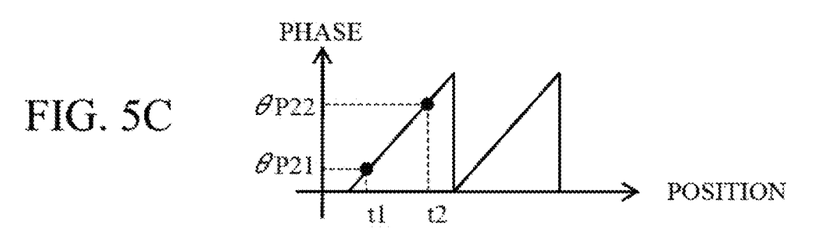
Figure 5D:
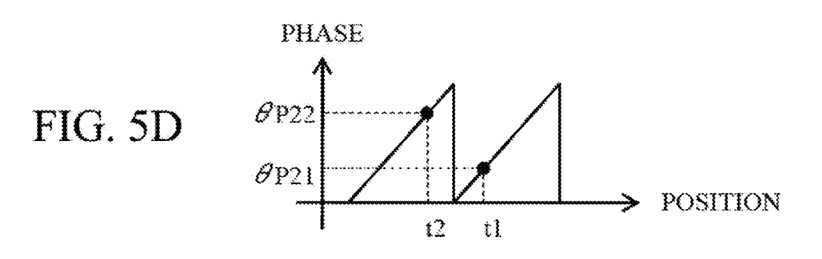

FIG. 5A shows a case of θP21>θP22 and t1<t2, and FIG. 5B shows a case of θP21>θP22 and t1>t2. FIG. 5C shows a case of θP21<θP22 and t1<t2, and FIG. 5D shows a case of θP21<θP22 and t1>t2.

Since the phase is calculated by performing arctan calculation on the two phase signals, a relative movement of the scale 10 and sensor 20 by one period of the P21/P22 patterns changes the phase continuously from 0 to $2\pi$. Then, entrance of the relative movement of the scale 10 and sensor 20 into a next period of the P21/P22 patterns returns the phase to 0.

In the case shown in FIG. 5A, the reading positions t1 and t2 on the P21/P22 patterns are included in mutually different periods and have a difference smaller than half of the period of the P21/P22 patterns, and the phase changes by $2\pi$ between the P21/P22 patterns. Thus, the difference between the phases θP21 and θP22 is greater than $\pi$ (θP21−θP22>$\pi$).

Similarly, in the case shown in FIG. 5B, the reading positions t1 and t2 are included in a same period in the P21/P22 patterns. Thus, the difference between the phases θP21 and θP22 is smaller than $\pi$ (θP21−P22<$\pi$).

Considering similarly the cases shown in FIGS. 5C and 5D, a phase error e is calculated in each of the four types of phase relations as shown by the following expressions (1). However, the phase error e is a phase error with reference to the reading position t1 in the position detection direction, that is, a difference of the phase θP22 from the phase θP21 as a reference.

In this embodiment, the final detected position is decided by using the phase θP11 detected from the first track 11 at the reading position t1 as a reference reading position. This configuration makes interpolation errors included in the three phases detected from the second track 12 unlikely to influence the final detected position. Particularly, this configuration is effective for a case where the interpolation error included in the phase detected from the second track 12 is larger than that included in the phase detected from the first track 11.

However, use of the reading position t1 as the reference is merely an example, and an arbitral position may be used as the reference. For example, if the interpolation error included in the phase detected from the first track 11 is nearly equal to that included in the phase detected from the second track 12, a middle point between the reading positions t1 and t2 may be used as the reference. Since this case averages the reading positions t1 and t2, it is possible to reduce an error included in the final detected position. Thus, the reference reading position can be decided depending on configurations of the encoder and the movable member holding the encoder.

$$e = \theta P22 - \theta P21 + 2\pi (\theta P21 > \theta P22 \text{ and } \theta P21 - \theta P22 \geq \pi) \quad (1)$$
$$= \theta P22 - \theta P21 (\theta P21 > \theta P22 \text{ and } \theta P21 - \theta P22 < \pi)$$
$$= \theta P22 - \theta P21 (\theta P21 < \theta P22 \text{ and } \theta P22 - \theta P21 \leq \pi)$$
$$= \theta P22 - \theta P21 - 2\pi (\theta P21 < \theta P22 \text{ and } \theta P22 - \theta P21 > \pi)$$

The phase errors e thus calculated with reference to the P21 pattern can be converted to an error of the light receiver 22 by multiplying the phase error e by $P21/(2\pi)$, and can be converted to a phase error with reference to a phase λ by multiplying the phase error e by λ/P21.

Since the phase θP12, θP22 and θP42 are obtained at the reading position t2, the position detection processor 33 calculates, by using the phase error e, phases corresponding to the reference reading position t1 as shown by the following expressions (2) to (4), in other words, corrects the phases θP12, θP22 and θP42. In the expressions (2) to (4), θP12z, θP22z and θP42z represent the phases corresponding to the reference reading position t1, and MOD(x,y) represents a remainder when x is a dividend and y is a divisor. A reason to calculate the reminder when $2\pi$ is the divisor is to express the phase as a value equal to 0 or more and less than $2\pi$.

$$\theta P12z = \text{MOD}(\theta P12 - e \times P12/P21, 2\pi) \quad (2)$$

$$\theta P22z = \text{MOD}(\theta P22 - e \times P22/P21, 2\pi) \quad (3)$$

$$\theta P42z = \text{MOD}(\theta P42 - e \times P42/P21, 2\pi) \quad (4)$$

Then, the position detection processor 33 calculates the final detected position from the six phases θP11, θP21, θP41, θP12z, θP22z and θP42z thus calculated. The number of periods of the P11, P21, P41, P12, P22 and P42 patterns are, as mentioned above, 4001, 2000, 998, 3983, 2000 and 908. The position detection processor 33 performs vernier operation using the six phases to produce seven phases $\theta_1$ to $\theta_7$ at mutually different periods as shown by the following expressions (5) to (11). The vernier operation provides, by using a phase difference between two sensor read signals (for example, the P11 and P21 signals), vernier periodic signals (that is, the above-mentioned phases $\theta_1$ to $\theta_7$) having periods different from those of the original sensor read signals.

$$\theta_1 = \text{MOD}(\theta P11 - 2 \times \theta P21, 2\pi) \quad (5)$$

$$\theta_2 = \text{MOD}(\theta P21 - 2 \times \theta P41, 2\pi) \quad (6)$$

$$\theta_3 = \text{MOD}(\theta P11 - 4 \times \theta P41, 2\pi) \quad (7)$$

$$\theta_4 = \text{MOD}(\theta P11 - \theta P12z, 2\pi) \quad (8)$$

$$\theta_5 = \text{MOD}(\theta P41 - \theta P42z, 2\pi) \quad (9)$$

$$\theta_6 = \text{MOD}(\theta P22z - 2 \times \theta P42z, 2\pi) \quad (10)$$

$$\theta_7 = \text{MOD}(\theta P12z - 4 \times \theta P42z, 2\pi) \quad (11)$$

As an example, description will be made of a method of calculating the phase $\theta_1$. The phase $\theta_1$ is a phase of a vernier periodic signal having one period in the total track length, which is calculated from the phase θP11 of the P11 pattern having 4001 periods in the total track length and the phase θP21 of the P21 pattern having 2000 periods in the total track length. When the total track length is represented by L, the phase θP21z changes from 0 to $2\pi$ for each relative displacement of the scale 10 and sensor 20 by L/2000. Thus, doubling the phase θP21 when a relation of 0≤θP21<π is satisfied and doubling the phase θP21z and subtracting $2\pi$ therefrom when a relation of π≤θP21<$2\pi$ is satisfied provides a phase changing from 0 to $2\pi$ for each relative displacement of the scale 10 and sensor 20 by L/4000. Then, calculating a phase difference between the phase changing from 0 to $2\pi$ for each relative displacement by L/4000 and the phase θP11 changing from 0 to $2\pi$ for each relative displacement by L/4001 provides the phase $\theta_1$ of the vernier periodic signal having one period in the total track length. The phases $\theta_2$ to $\theta_7$ can be similarly calculated.

The phase $\theta_1$ to $\theta_7$ are phases of vernier periodic signals respectively having 1, 4, 9, 18, 90, 184 and 351 periods in the total track length, and the phase $\theta_1$ shows position in the total track length. On the other hand, using a phase of a periodic signal having a greater number of periods in the total track length further increases position detection accuracy. Thus, the position detection processor 33 calculates, by using the phases θP11 and θP41 in addition to the phases $\theta_1$ to $\theta_7$, an absolute position with an accuracy attainable by the phase θP11.

The position detection processor 33 first calculates an absolute position from the phases $\theta_1$ and $\theta_2$ with an accuracy attainable by the phase $\theta_2$. Since the phase $\theta_2$ is a phase of the vernier periodic signal having four periods in the total track length, determining, from a phase relation between $\theta_1$ and $\theta_2$, an area where the sensor 20 reads among four areas defining by dividing the total track length enables calculation of the absolute position with the accuracy attainable by the phase $\theta_2$. When the reading area where the sensor 20 reads is represented by $a_1$, the reading area $a_1$ can be calculated by the following expression (12). In the expression (12), $a_1$ is given by any one of integers 0, 1, 2 and 3, and ROUND(x) represents a function returning the integer i that satisfies a relation of i−½≤x<i+½.

$$a_1 = \text{ROUND}((4 \times \theta_1 - \theta_2)/(2\pi)) \quad (12)$$

Figure 6:
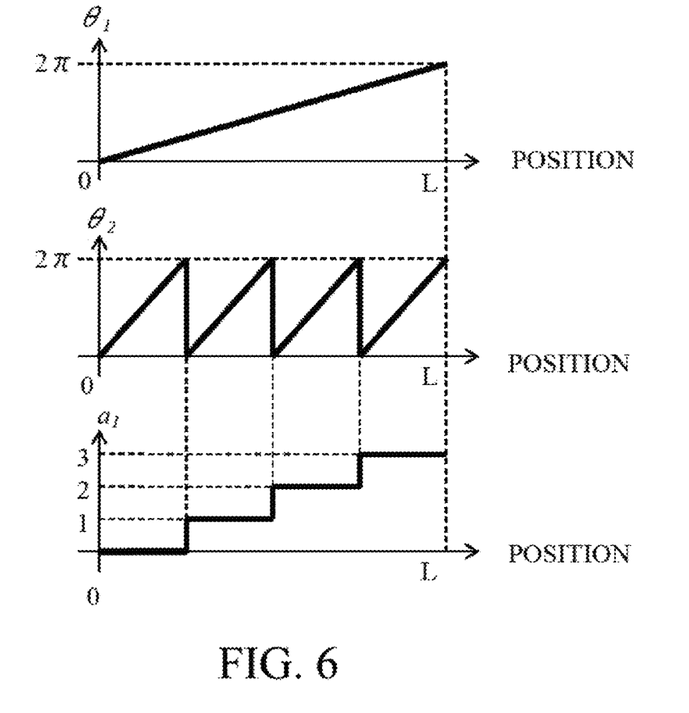
FIG. 6 shows a relation among phases ($\theta_1$ and $\theta_2$) and a reading area ($a_1$) in the encoder of Embodiment 1.

FIG. 6 shows a relation among the phase $\theta_1$, the phase $\theta_2$ and the reading area $a_1$. The phase $\theta_1$ changes from 0 to $2\pi$ once in the total track length, and the phase $\theta_2$ changes from 0 to $2\pi$ four times in the total track length. Therefore, quadrupling $\theta_1$ and subtracting $\theta_2$ therefrom provides values of 0, $2\pi$, $4\pi$, $6\pi$ with increments of $2\pi$, and dividing them by $2\pi$ provides $a_1$. However, just division by $2\pi$ may provide $a_1$ other than integer due to influences of noise, interpolation error and quantization error. Thus, this embodiment rounds the value of $(4 \times \theta_1 - \theta_2)/(2\pi)$ to provide $a_1$ as integer. Determining the reading area $a_1$ is equal to, in an incremental encoder, determining a relative movement amount from an origin. Therefore, a position $x_2$ can be calculated from $a_1$ and $\theta_2$ as shown by the following expression (13) where L represents the total track length:

$$x_2 = a_1 \times L/4 + \theta_2 \quad (13)$$

Next, the position detection processor 33 similarly calculates a position from the position $x_2$ and the phase $\theta_3$ with an accuracy attainable by the phase $\theta_3$. When the reading area is represented by $a_2$ and the position calculated with the accuracy attainable by the phase $\theta_3$ is represented by $x_3$, nine periods of the phase $\theta_3$ are included in the total track length, so that the reading area $a_2$ and the position $x_3$ are calculated by the following expressions (14) and (15):

$$a_2 = \text{ROUND}((9 \times x_2 - \theta_3)/(2\pi)) \quad (14)$$

$$x_3 = a_2 \times L/9 + \theta_3 \quad (15)$$

Thereafter, the position detection processor 33 similarly repeats calculation using the following expressions (16) and (17) to calculate a position $x_9$ with an accuracy attainable by the phase θP11. In the expressions (16) and (17), $\theta_1 = x_1$, $\theta_8 = \theta P41$, $\theta_9 = \theta P11$ and i represents an integer within a range of 1≤i≤8. Moreover, $n_i$ represents the above-mentioned number of periods of the phase $\theta_i$ in the total track length.

$$a_i = \text{ROUND}((n_i \times x_i - \theta_{i+1})/(2\pi)) \quad (16)$$

$$x_{i+1} = a_i \times L/n_i + \theta_i + 1 \quad (17)$$

The position detection processor 33 thus calculates the position $x_9$ as the final detected position with the accuracy attainable by the phase θP11.

Although this embodiment described the case where the P21 pattern provided in the first track 11 has the same period and the same phase as those of the P22 pattern provided in the second track 12, these periods and phases are not necessarily required to be the same. In other words, it is only necessary that signals having same periods and same phases can be acquired by calculation from the first and second tracks 11 and 12.

For example, the P22 pattern is shifted with respect to the P21 pattern by a phase of π. In this case, the phases θP21 and θP22 obtained from the respective periodic patterns have a difference of π, and therefore addition or subtraction of the difference enables acquisition of signals having same periods and same phases.

Moreover, the period P22 may be ½ (integral fraction) of the period P21. Also in this case, doubling the phase θP22 to normalize it to a value equal to 0 or more and less than 2π enables acquisition of the P22 signal having the same period and the same phase as those of the P21 signal. The integral fraction means "×1/m" where m represents any integer equal to or greater than 2, such as "×⅓" and "×¼". Similarly, the period P22 may be an integral multiple (double or more) of the period P21.

Then, after acquiring the P21 and P22 signals having the same periods and the same phases from the first and second tracks 11 and 12, a difference therebetween may be treated as the position error or the phase error as well as in this embodiment.

Although this embodiment described the process to perform detection of one final absolute position (one position detection), there may be a case where multiple position detections are requested depending on environment in which the encoder is used. The sensor reading position error and the phase error in this case may be calculated each time the encoder is requested to perform the position detection, or may be calculated only once before shipment of the encoder or at power-on thereof and thereafter the same calculated error may be used.

For example, in a case where influence of deformation of the scale 10 is significant as shown in FIG. 4C, it is desirable that the phase error be calculated each time the encoder is requested to perform the position detection. However, in a case where a shift amount between the scale 10 and the sensor 20 is fixed as shown in FIGS. 4B and 4D, repeatedly using the once calculated error enables simplification of the position detection process.

Although this embodiment described the configuration in which the scale 10 is provided with the two tracks 11 and 12 and each track is provided with the three types of periodic patterns, this configuration is merely an example, and other configuration may be employed. For example, the scale may be provided with three or more tracks, and each track may be provided with four or more types of periodic patterns. Moreover, one of the two tracks may be provided with two types of periodic patterns and the other thereof may be provided with a single periodic pattern. Increasing number of types of periodic patterns having mutually different periods in one track increases amount of information, but makes calculation complicated because of necessity of separation of many signals. Therefore, it is desirable to select the number of types of periodic patterns provided in one track on a basis of balance of necessary information amount and ease of calculation.

As described above, this embodiment compensates for the phase error in the case of performing the vernier operation (vernier signal processing) from the multiple sensor read signals whose periods are mutually different to improve accuracy of the vernier periodic signal. This embodiment can be also applied to compensation for a sensor reading error due to a relative displacement in the position detection direction in a case where, in addition to the relative displacement shown in FIGS. 4B and 4C, the installation oblique shift of the scale 10 about the Z axis shown in FIG. 4D is generated. In this case, an oblique angle θs of the scale is calculated by arcsin(e/2π× P21/D) from a relation between the sensor reading position error (e/2π×P21) in the position detection direction (X direction) calculated from the detected phase error e and the center-to-center distance D of the reading areas on the two tracks in the scale width direction (Y direction). Then, a position error Δp(x) (=x×(cos θs−1)) at the detected position x in the position detection direction is calculated, and using the calculated position error Δp(x) for compensation for the final detected position makes it possible to further improve the accuracy of the position detection.

Moreover, detecting the oblique angle θs of the scale at each predetermined period with the relative movement of the scale and sensor and calculating cumulated errors (cumulative error) makes it possible to more highly accurately correct the final detected position. Furthermore, whether or not the third periodic pattern provided in the second track is used for the calculation of the absolute position has no relation to the error compensation.

Embodiment 2

Figure 7:
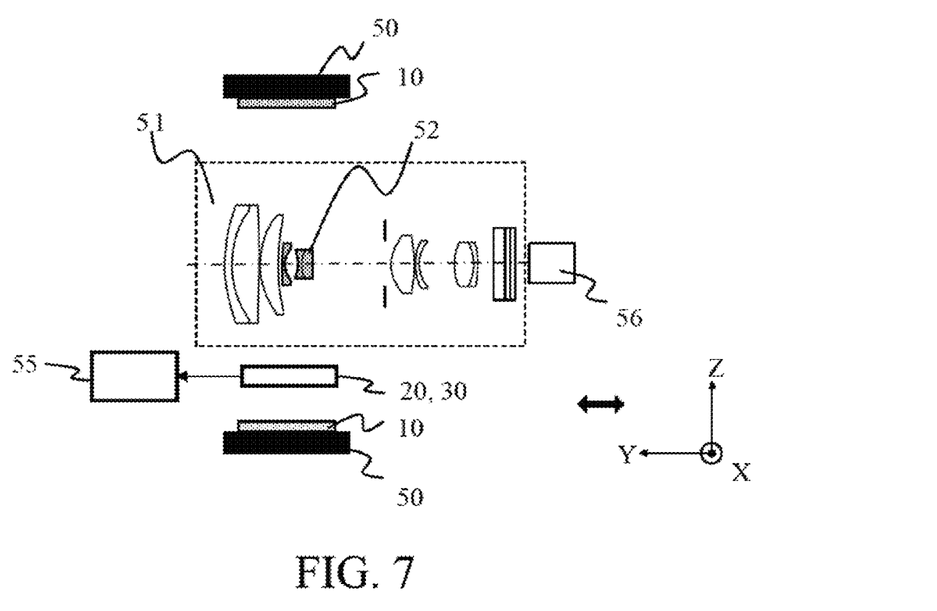
FIG. 7 shows a configuration of an image pickup apparatus that is Embodiment 2 of the present invention.

FIG. 7 shows a configuration of an image pickup apparatus (or an optical apparatus) such as a digital still camera or a video camera, as an example of the apparatus equipped with the encoder described in Embodiment 1. This image pickup apparatus uses the encoder for detecting an absolute position of a movable lens in a lens barrel.

In FIG. 7, reference numeral 10 denotes a scale, reference numeral 20 denotes a sensor, and reference numeral 30 denotes a signal processor. The scale 10, the sensor 20 and the signal processor 30 constitute the encoder described in Embodiment 1. The scale 10 is attached to an inner circumferential surface of a cam ring 50 having a cylindrical shape and being rotatable about an optical axis in the lens barrel. The cam ring 50 is rotationally driven by an actuator (not shown).

The lens barrel houses an image capturing optical system 51. The image capturing optical system 51 includes a movable lens 52 (such as a magnification-varying lens or a focus lens). The movable lens 52 is moved in a direction of the optical axis by a cam formed in the cam ring 50 when the cam ring 50 is rotated.

Reference numeral 55 denotes a CPU that controls an entire system of the image pickup apparatus. Reference numeral 56 denotes an image sensor that photoelectrically converts an object image formed by the image capturing optical system 51. The image sensor 56 is constituted by a CCD sensor or a CMOS sensor.

When the cam ring 50 is rotated for moving the movable lens 52, an absolute rotation position of the cam ring 50, that is, the absolute position of the movable lens 52 in the optical axis direction is detected by the encoder, and information on the detected absolute position is output to the CPU 55.

The CPU 55 drives the actuator based on the information on the absolute position to rotate the cam ring 50 so as to move the movable lens 52 to a target position.

The encoder described in Embodiment 1 can be used not only for the above-described image pickup apparatus, but also for various apparatuses such as a printer (optical apparatus) performing position detection of a print head or a sheet-supplying roller, a copier (optical apparatus) performing position detection of a photoconductive drum, and a robot and a carrier apparatus performing position detection of a robot arm or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-105120, filed on May 2, 2012, which is hereby incorporated by reference herein in its entirety.

What is claimed is:

1. An encoder comprising:
a scale provided with a first track and a second track each including at least one periodic pattern;
a sensor relatively movable with the scale and configured to read the periodic patterns in the first and second tracks to output periodic signals respectively corresponding to the read periodic patterns with a relative movement of the sensor and the scale; and
a processor configured to calculate a detection position in a relative movement direction of the scale and sensor by using the periodic signals,
wherein:
the first track includes a first periodic pattern and a second periodic pattern whose periods are mutually different, and the second track includes a third periodic pattern whose period is different from that of the second pattern and is one of an integral multiple and an integral fraction of that of the first periodic pattern,
the sensor is configured to output a first periodic signal corresponding to the first periodic pattern, a second periodic signal corresponding to the second periodic pattern and a third periodic signal corresponding to the third periodic pattern, and
the processor is configured (a) to calculate an error by using a phase difference between the first and third periodic signals, the error being due to a relative displacement between the first and second tracks and the sensor, and (b) to calculate the detection position after correction of the error, by using the error and at least the first and second periodic signals.

2. An encoder according to claim 1, wherein the relative displacement is caused by at least one of a relative positional shift of the scale and sensor in the relative movement direction and a deformation of the scale.

3. An encoder according to claim 1, wherein the processor is configured to calculate the detection position after correction of the error, by using the error and the first, second and third periodic signals.

4. An apparatus comprising:
an encoder; and
a movable member whose position is detected by using the encoder,
wherein the encoder comprises:
a scale provided with a first track and a second track each including at least one periodic pattern;
a sensor relatively movable with the scale and configured to read the periodic patterns in the first and second tracks to output periodic signals respectively corresponding to the read periodic patterns with a relative movement of the sensor and the scale; and
a processor configured to calculate a detection position in a relative movement direction of the scale and sensor by using the periodic signals,
wherein:
the first track includes a first periodic pattern and a second periodic pattern whose periods are mutually different, and the second track includes a third periodic pattern whose period is different from that of the second pattern and is one of an integral multiple and an integral fraction of that of the first periodic pattern,
the sensor is configured to output a first periodic signal corresponding to the first periodic pattern, a second periodic signal corresponding to the second periodic pattern and a third periodic signal corresponding to the third periodic pattern, and
the processor is configured (a) to calculate an error by using a phase difference between the first and third periodic signals, the error being due to a relative displacement between the first and second tracks and the sensor, and (b) to calculate the detection position after correction of the error, by using the error and at least the first and second periodic signals.

\* \* \* \* \*